(12) United States Patent
Lu et al.

(10) Patent No.: US 9,165,684 B2
(45) Date of Patent: Oct. 20, 2015

(54) FAULT BITS SCRAMBLING MEMORY AND METHOD THEREOF

(71) Applicant: National Taiwan University of Science and Technology, Taipei (TW)

(72) Inventors: Shyue-Kung Lu, Taipei (TW); Hao-Cheng Jheng, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 86 days.

(21) Appl. No.: 14/230,554

(22) Filed: Mar. 31, 2014

(65) Prior Publication Data
US 2015/0019924 A1 Jan. 15, 2015

(30) Foreign Application Priority Data
Jul. 9, 2013 (TW) .............................. 102124565 A (51) Int. Cl.
*G11C 29/00* (2006.01)
*G11C 29/44* (2006.01)

(52) U.S. Cl.
CPC .................................. *G11C 29/4401* (2013.01)

(58) Field of Classification Search
CPC ................... G11C 29/4401; G11C 2019/4402; G11C 29/76; G11C 29/822
USPC .......................................................... 714/718
See application file for complete search history.

(56) References Cited

U.S. PATENT DOCUMENTS

| | | | | |
|---|---|---|---|---|
| 5,233,614 A | * | 8/1993 | Singh ............................ | 714/723 |
| 5,943,283 A | * | 8/1999 | Wong et al. .............. | 365/230.01 |
| 6,366,995 B1 | * | 4/2002 | Vilkov et al. ................. | 711/206 |
| 2004/0233767 A1 | * | 11/2004 | Wu et al. ....................... | 365/232 |

* cited by examiner

*Primary Examiner* — David Ton
(74) *Attorney, Agent, or Firm* — Muncy, Geissler, Olds & Lowe, P.C.

(57) ABSTRACT

A fault bits scrambling memory and method thereof relate to a memory including at least one memory bank. The memory bank includes a memory module, a scrambling-logic unit, a self-testing unit and a scrambling code generating unit. The memory module includes a plurality of pages. Each page has a plurality of memory cells, and each memory cell has a physical address. The scrambling logic unit receives a scrambling code and the physical address to generate a mapping address by logical calculation, and outputs the mapping address to the memory module. The self-testing unit detects the faulty memory cells of each page. The scrambling code generating unit is applied to generate the scrambling code to maintain the number of the faulty memory cells corresponding to the mapping address of the same page is up to a maximum tolerance.

9 Claims, 6 Drawing Sheets

FAULT BITS SCRAMBLING MEMORY AND METHOD THEREOF

CROSS-REFERENCES TO RELATED APPLICATIONS

This non-provisional application claims priority under 35 U.S.C. §119(a) on Patent Application No. 102124565 filed in Taiwan, R.O.C. on Jul. 9, 2013 the entire contents of which are hereby incorporated by reference.

BACKGROUND

1. Technical Field

The disclosure relates to a memory, and particularly to a fault bits scrambling memory and method thereof.

2. Related Art

Commonly, the non-volatile memories, such as the flash memories, use the error correction code (ECC) to repair the soft error or the physical fault (hereinafter, the soft error and the physical fault are called fault) of the memory cell. However, using the error correction code to repair the data is limited; for example, the single-error-correcting and double-error-detecting (SEC-DED) algorithm can only repair the single faulty bits. If more than one bit must be repaired, it must apply other algorithms and further storing spaces must be applied for the algorithms, thereby reducing the available memory space. Hence, how to solve the issue of the faulty memory cells exceeding the maximum tolerance is an urgent issue to be solved by the inventor of the disclosure and related personnel.

SUMMARY

In view of this, the disclosure provides a fault bits scrambling memory and method thereof for distributing the faulty memory cells into different pages so as to improve the repair rate and the yield of the memory.

One invention concept of the disclosure provides a fault bits scrambling memory including at least a memory bank. The memory bank includes a memory module, a scrambling code generating unit, a scrambling logic unit and a self-testing unit. The memory module includes a plurality of pages. Each page includes a plurality of memory cells. Each memory cell has a physical address. The scrambling logic unit receives a scrambling code and the physical address to generate a mapping address by logical computation, and outputs the mapping address to the memory module, so that an external module accesses the data of the memory cell corresponding to the mapping address according to the physical address. The self-testing unit detects faulty memory cells of each page to generate a faulty information. The scrambling code generating unit receives the faulty information and generates the scrambling code to maintain the number of the faulty memory cells corresponding to the mapping address of the same page is up to a maximum tolerance.

Another invention of concept of the disclosure provides a fault bits scrambling method applicable to a memory. Wherein, the memory has a plurality of pages, each page includes a plurality of memory cells, and each memory cell has a physical address. The method includes detecting the faulty memory cells of each page to generate a faulty information, generating a scrambling code, executing a logical computation with the scrambling code and each physical address, and verifying the number of the faulty memory cells corresponding to the mapping address of the same page is up to a maximum tolerance.

As described, the fault bits scrambling memory bank and method thereof direct the physical address of the memory bank to different memory cells through mapping, so that the number of the faulty memory cells in one page can be reduced, thereby preventing the volume of the resource region for executing the build-in redundancy analysis algorithm from increasing or preventing the volume of the correction-code region for executing the error correcting algorithm from increasing. Therefore, the repair rate and the yield rate of the memory bank are improved. Additionally, for the phase change memory, the issue raised from the wearing out of the memory cells is overcame by the fault bits scrambling memory bank and method thereof.

The detailed features and advantages of the disclosure are described below in great detail through the following embodiments, the content of the detailed description is sufficient for those skilled in the art to understand the technical content of the disclosure and to implement the disclosure there accordingly. Based on the content of the specification, the claims, and the drawings, those skilled in the art can easily understand the relevant objectives and advantages of the disclosure.

BRIEF DESCRIPTION OF THE DRAWINGS

The disclosure will become more fully understood from the detailed description given herein below for illustration only and thus not limitative of the disclosure, wherein.

DETAILED DESCRIPTION

Figure 1:
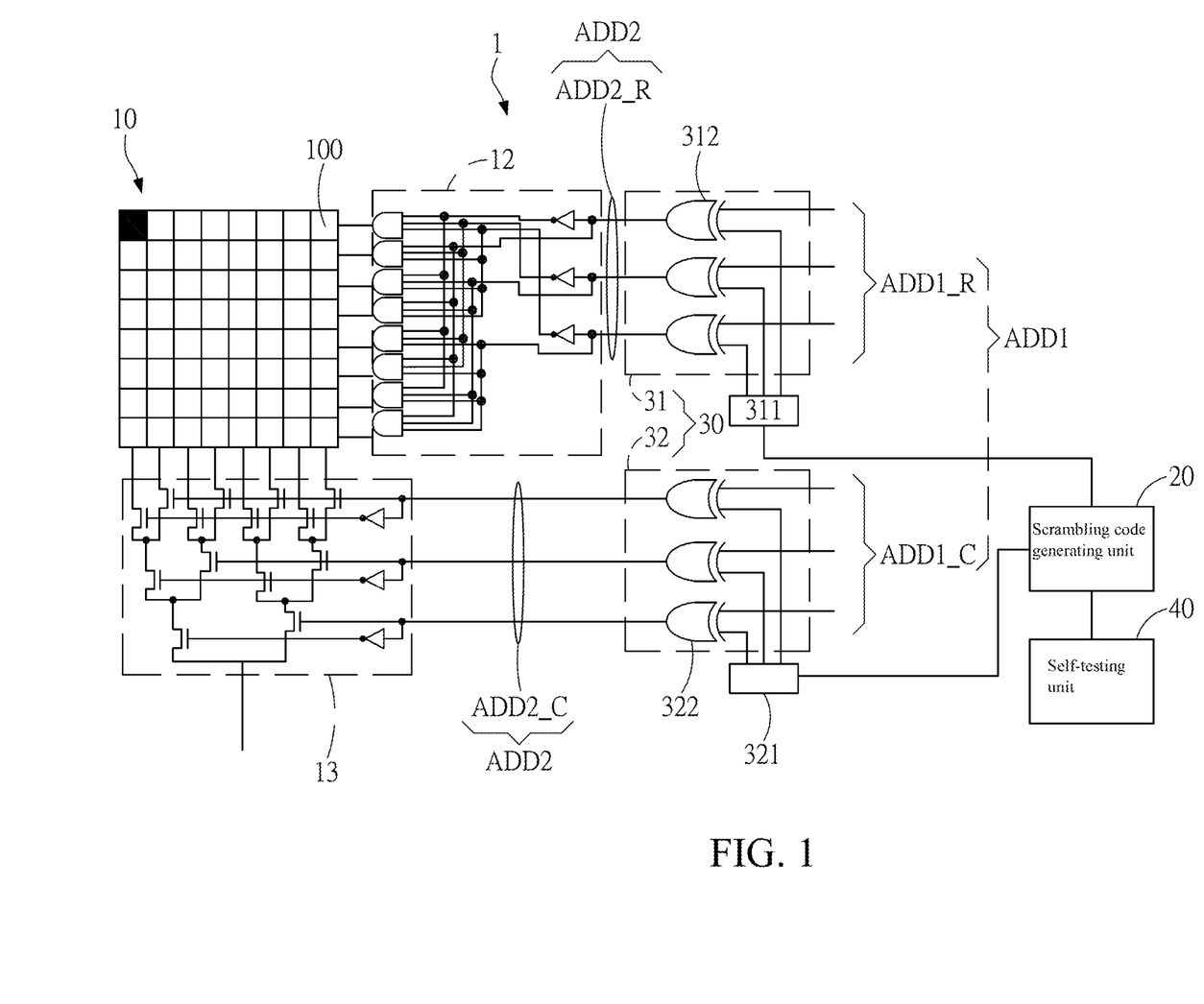
FIG. 1 is schematic constructional view of a faulty bits scrambling memory bank of one embodiment of the disclosure.
Figure 2:
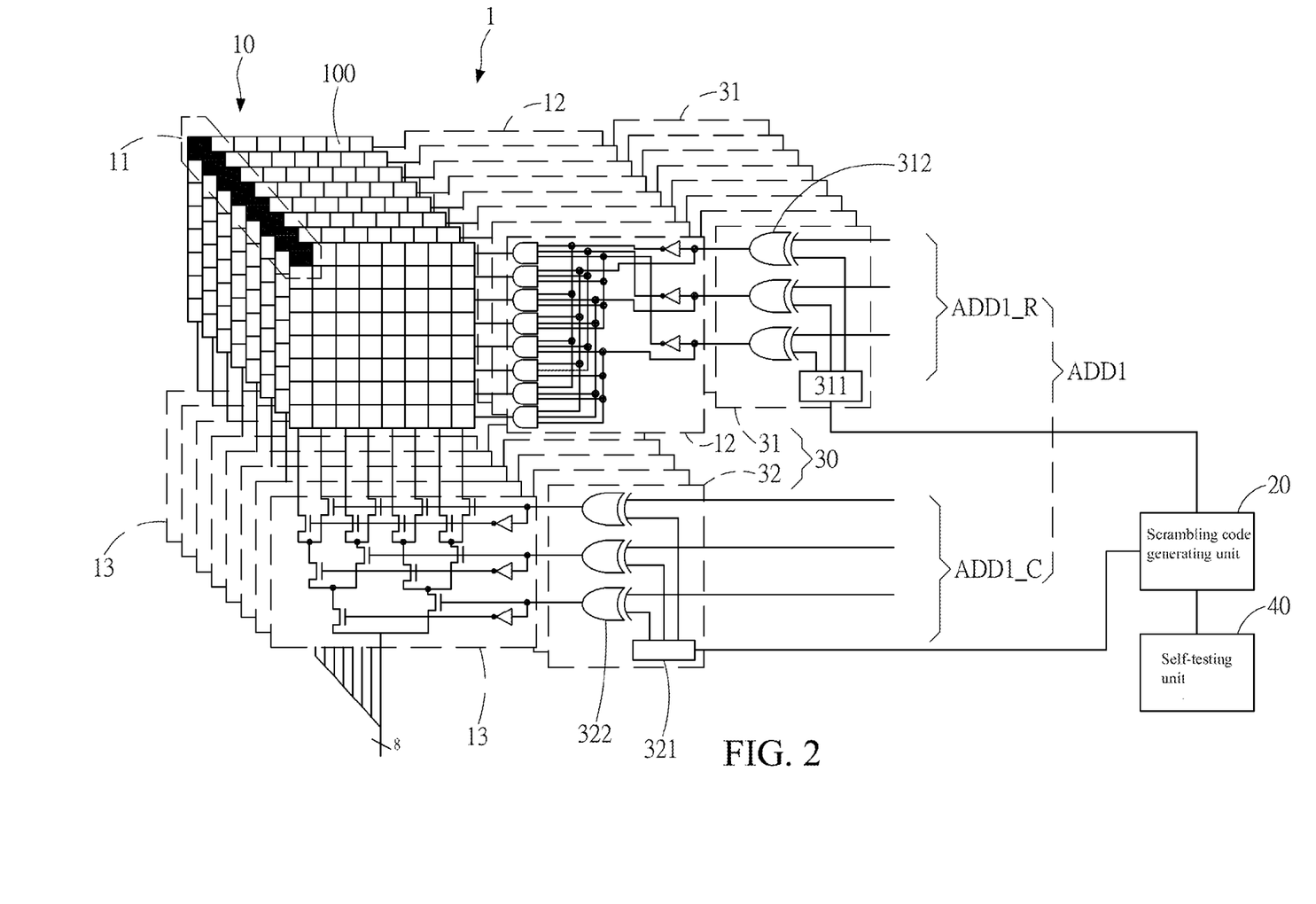
FIG. 2 is a schematic constructional view of the combining of a number of memory banks of one embodiment of the disclosure.

FIG. 1 is schematic constructional view of a faulty bits scrambling memory bank 1 of one embodiment of the disclosure, and FIG. 2 is a schematic constructional view of the combining of a number of memory banks 1 of one embodiment of the disclosure. Please refer to FIGS. 1-2, in which each memory bank 1 includes a memory module 10, a scrambling code generating unit 20, a scrambling logic unit 30 and a self-testing unit 40. That is, one embodiment of the disclosure includes many memory banks 1, but embodiments are not limited thereto; some embodiments include only one memory bank 1. Here, the memory bank 1 can be the dynamic random access memory (DRAM), static random access memory (SRAM), phase change memory (PCM), or other non-volatile memories.

The memory module 10 includes a plurality of memory cells 100 (as shown in FIG. 1). Each memory cell 100 has a physical address ADD1. Here, the memory cell 100 can be a single-level cell (SLC), a multi-level cell (MLC), or a triple-level cell (TLC). For the sake of convenience of description, this embodiment takes the single-level cell as an example.

Figure 3:
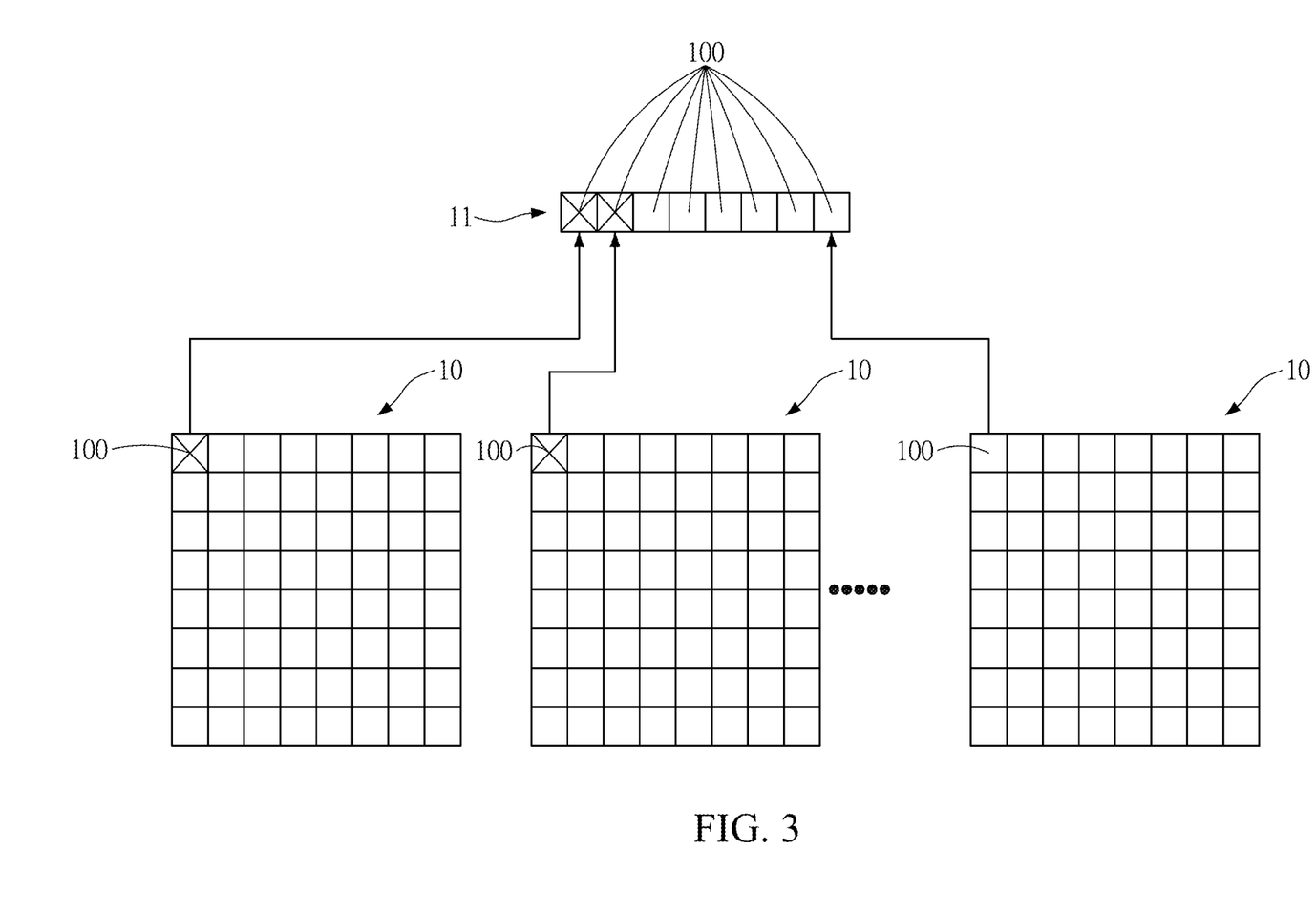
FIG. 3 is a schematic view for showing the forming of the page of one embodiment of the disclosure.

FIG. 3 is a schematic view for showing the forming of the page of one embodiment of the disclosure. Please refer to FIGS. 2-3, in which a page 11 is respectively formed after combing each memory cell 100 corresponding to the memory module 10 of each memory bank 1. It is understood that FIGS. 2-3 are provided for illustration and description, but embodiments are not limited thereto. One page 11 is formed if each memory cell 100 shown in the upper left portion of each memory module 10 of FIG. 2 is respectively retrieved and combined with each other. That is, the memory bank 1 retrieves the memory cell 100 shown in the upper right portion from each memory module 10 of FIG. 2 to form another page 11. The detail construction of the page 11 is described later.

Please refer to FIGS. 1-2, in which the scrambling logic unit 30 receives a scrambling code and the physical address ADD1 to generate a mapping address ADD2 by logical computation, and outputs the mapping address ADD2 to the memory module 10 so that an external module accesses the data of the memory cell 100 corresponding to the mapping address ADD2 according to the physical address ADD1. That is, when an external processor is connected to the memory bank 1 of the disclosure for loading, reading in, deleting or other actions (namely, the aforementioned accessing action), the external processor outputs the physical address ADD1, and the memory cells 100 corresponding to the mapping address ADD2 are substantially accessed in the memory bank 1. With a proper scrambling code and a proper algorithm, the faulty memory cells 100 originally located at the same page 11 are distributed into different pages 11 as much as possible. Based on this, the faulty data which cannot be repaired by prior arts are able to be repaired and corrected.

The self-testing unit 40 detects whether the memory cells 100 of each page 11 are faulty or not so as to generate a faulty information. The faulty information can include the number of the faulty memory cells 100 and the physical address(es) ADD1 of the faulty memory cell(s) 100.

The scrambling code generating unit 200 receives the faulty information generated from the self-testing unit 40 and finds out the scrambling code corresponding to the faulty information by using an algorithm, so that the memory cells 100 corresponding to the mapping address ADD2 generated after executing the logical computation with the physical address ADD1 of the faulty memory cells 100 and the scrambling code belongs to different pages 11. In other words, the number of the faulty memory cells 11 (the cross-signed block of the memory module 10 shown in FIG. 3), corresponding to the mapping address ADD2 of the same page 11 is up to a maximum tolerance. Here, the maximum tolerance is one bit, but embodiments are not limited thereto. The algorithm can be a trial and error algorithm, in which different scrambling codes are tried sequentially until a proper value is figured out and applied as the scrambling code, but embodiments are not limited thereto.

As shown in FIG. 1, in one embodiment, the memory bank 1 further includes a row decoder circuit 12 and a column decoder circuit 13. The physical address ADD1 includes a first column address ADD1_C and a first row address ADD1_R. The scrambling logic unit 30 includes a row scrambling logic circuit 31 and a column scrambling logic circuit 32. The column scrambling circuit 32 receives the scrambling code and the first column address ADD1_C to generate a second column address ADD2_C. The row scrambling circuit 31 receives the scrambling code and the first row address ADD1_R to generate a second row address ADD2_R. The second column address ADD2_C and the second row address ADD_2R are combined to be the mapping address ADD2.

Here, although the memory bank 1 shown in FIG. 1 has column address lines, row address lines and corresponding decoder circuits and scrambling logic circuits, it is understood that in some implementation aspects, the memory bank 1 shares the column address lines and the row address lines, and those who is skilled in the arts can make proper adjustments to the embodiments of the disclosure according to circumstances. For example, one scrambling logic circuit is connected to the row decoder circuit 12 and the column decoder circuit 13 respectively in some embodiments, so that the row decoder circuit 12 and the column decoder circuit 13 share the scrambling logic circuit.

As shown in FIG. 1, the row scrambling logic circuit 31 and the column scrambling logic circuit 32 respectively include a plurality of Exclusive-OR gate 312/322 (hereinafter, abbreviated XOR gate). Each first XOR gate 312 receives a bit of the first row address ADD1_R, and each second XOR gate 322 receives a bit of the first column address ADD1_C, but the row scrambling logic circuit 31 and the column scrambling logic circuit 32 are not limited thereto; in some embodiments, the row scrambling logic circuit 31 and/or the column scrambling logic circuit 32 includes other logic components (for example, the AND gate, the NOT gate, the NAND gate, the NOR gate, the XAND gate, etc), or the combination thereof (for example, a half adder includes the XOR gate(s) and the AND gate(s)).

In one embodiment, as shown in FIG. 1, a row scrambling code register 311 is located between the scrambling code generating unit 20 and the row scrambling logic circuit 31 to store the scrambling code. A column scrambling code register 321 is located between the scrambling code generating unit 20 and the column scrambling logic circuit 32 to store the scrambling code. Hence, after the scrambling code generating unit 20 generates the scrambling code, the scrambling code are respectively read in the row scrambling code register 311 and the column scrambling code register 321 in advance for the later conversion of the physical address ADD1 into the mapping address ADD2.

In another embodiment, the scrambling code is divided into a column scrambling code and a row scrambling code. The column scrambling code register 321 stores the column scrambling code, and the row scrambling code register 311 stores the row scrambling code. Here, the column scrambling code and the row scrambling code can have different values. Based on this, the column scrambling code and the row scrambling code having different values result more combination results as comparing with the column scrambling code and the row scrambling code having the same value, thus a great number of faulty memory cells 100 are able to be distributed into different pages 11.

Figure 4:
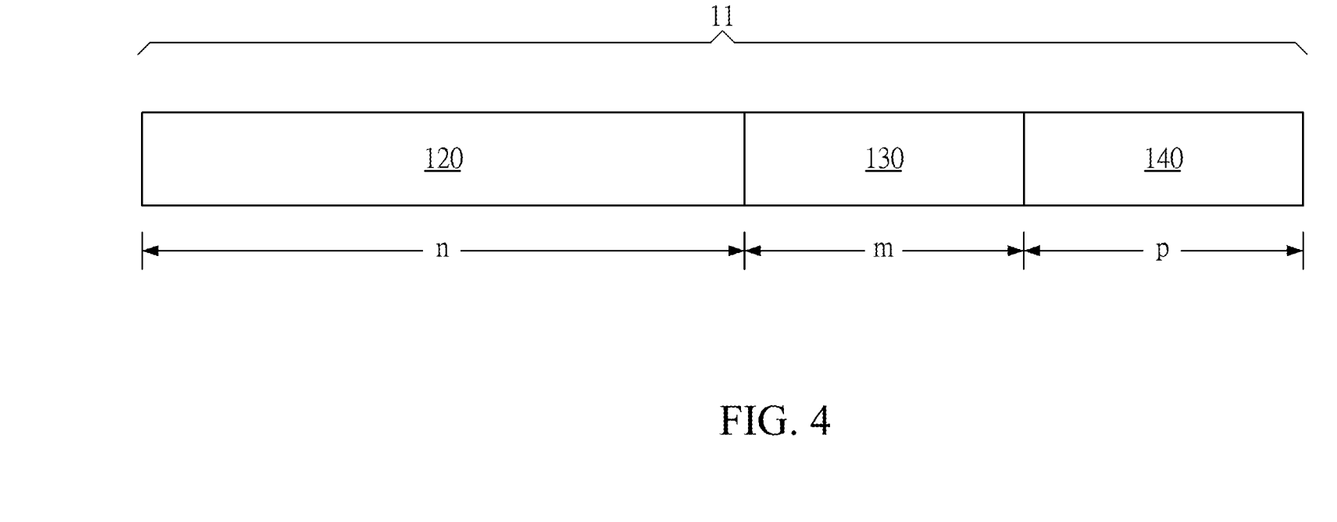
FIG. 4 is a schematic constructional view of the page of one embodiment of the disclosure.

Please refer to FIG. 4, which is a schematic constructional view of the page 11 of one embodiment of the disclosure. The page 11 includes a data region 120, a correction-code region 130, and a resource region 140. The data region 120 is provided for storing the data to be stored in an outer controller (not shown), and the volume of the data region 120 is n bits. The correction-code region 130 is provided for storing the error correction code, and the volume of the correction-code region 130 is m bits. The correction-code region 130 of each page 11 stores one error correction code. An error correcting algorithm based on the error correction code is applied to repair the faulty memory cells 100 of the page 11, and the maximum number of the faulty memory cells 100 to be repairable is the maximum tolerance. Once the maximum tolerance needs to be increased, a correction-code region 130 having larger volume is necessary. The resource region 140 is provided for storing backup resource for executing a built-in redundancy analysis algorithm. The volume of the resource region 140 is p bits and is adjustable according to the repairing ability to be achieved.

Here, the error correction code applies the single-error-correcting and double-error-detecting (SEC-DED) technology, but embodiments of the error correcting algorithm are not limited thereto; in some embodiments, for example, the single error correcting algorithm using Hamming codes, Hsiao codes or other correction codes for repairing single error is applied thereto so as to repair one page 11 having single faulty memory cell 100. In some embodiments, for example, the double error correcting algorithm using BCH code or other correction codes for repairing double errors is applied thereto so as to repair one page 11 having more than two faulty memory cells 100.

As shown in FIGS. 1-3, in which the first memory cell 100 of each memory bank 1 is formed as the page 11. However, when using the scrambling logic unit 30 to convert the physical address ADD1 outputted by the outer processor into the mapping address ADD2, the memory cells 100 corresponding to the page 11 may be not the first memory cell 100 of each memory bank 1. In other words, the first memory cell 100 of the first memory bank 1 (one faulty memory cell 100), and the second memory cell 100 of the second memory bank 1 (another faulty memory cell 100), belong to different pages 11. Therefore, the page 11 having two faulty memory cells 100 originally will have less faulty memory cells 100 (one or none faulty memory cell 100), after being mapped through the scrambling logic unit 30.

Figure 5:
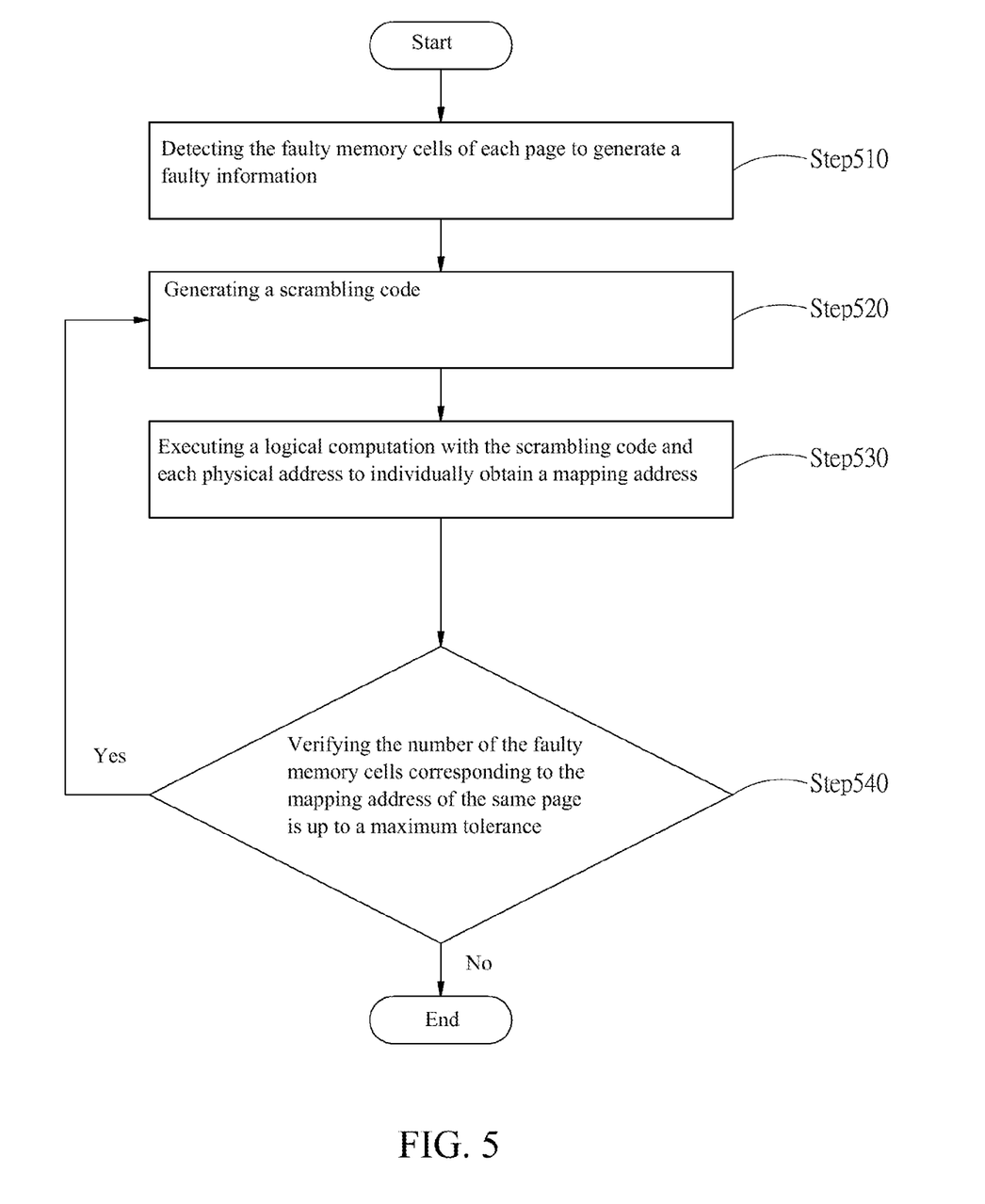
FIG. 5 is a flow chart of a fault bits scrambling method of one embodiment of the disclosure.

Please refer to FIG. 5, which is a flow chart of a fault bits scrambling method of one embodiment of the disclosure. The fault bits scrambling method is applicable to the aforementioned memory bank 1. After the memory bank 1 is enabled (or booted), following steps are executed.

Firstly, step 510, executing a build-in self-test (BIST), so as to detect the faulty memory cells 100 of each page 11 to generate a faulty information. The faulty information includes the number and the physical addresses ADD1 of the faulty memory cells 100.

And, step 520, generating a scrambling code by using an algorithm (such as the trial and error algorithm mentioned above) corresponding to the faulty information.

After the step 520, executing a logical computation with the scrambling code and each physical address ADD1 to individually obtain a mapping address ADD2 (step 530).

Lastly, step 540, verifying the number of the faulty memory cells 100 corresponding to the mapping address ADD2 of the same page 11 is up to a maximum tolerance. When the number of the faulty memory cells 100 exceeds the maximum tolerance, execute step 520 for trying another scrambling code; when the number of the faulty memory cells 100 does not exceed the maximum tolerance, terminate the method. Based on this, upon an outer controller accessing each memory bank 1 having faulty memory cells 100 in the same page 11, the data of the faulty memory cells 100 is ensured to be repaired by the method so that the outer controller accesses the memory bank 1 with correct data.

In one embodiment, after the step 540, further includes following steps. Firstly, accessing the data of the memory cell 100 corresponding to the mapping address ADD2 according to the physical address ADD1. And then, generating an error correction code based on the data stored in the memory cells 100 of the same page 11 according to an error correcting algorithm (for example, the SEC-DED algorithm). Thereafter, storing the error correction code in the page 11. Lastly, executing the error correcting algorithm according to the error correction code to repair the data stored in the faulty memory cell 100 upon one of the pages 11 having the faulty memory cell 100.

In another embodiment, executing the build-in redundancy analysis algorithm mentioned above upon parts of the data stored in the faulty memory cells 100 are still unrecovered after the error correcting algorithm is executed or upon the predicted number of the memory cells 100 exceeds the maximum tolerance so as to repair the data stored in the faulty memory cells 100.

As referred to previously, the fault bits scrambling memory bank 1 and method thereof direct the physical address ADD1 of the memory bank 1 to different memory cells 100 through mapping, so that the number of the faulty memory cells 100 in one page 11 can be reduced, thereby preventing the volume of the resource region 140 for executing the build-in redundancy analysis algorithm from increasing or preventing the volume of the correction-code region 130 for executing the error correcting algorithm from increasing. Therefore, the repair rate and the yield rate of the memory bank 1 are improved. Additionally, for the phase change memory, the issue raised from the wearing out of the memory cells 100 is overcame by the fault bits scrambling memory bank 1 and method thereof.

Figure 6:
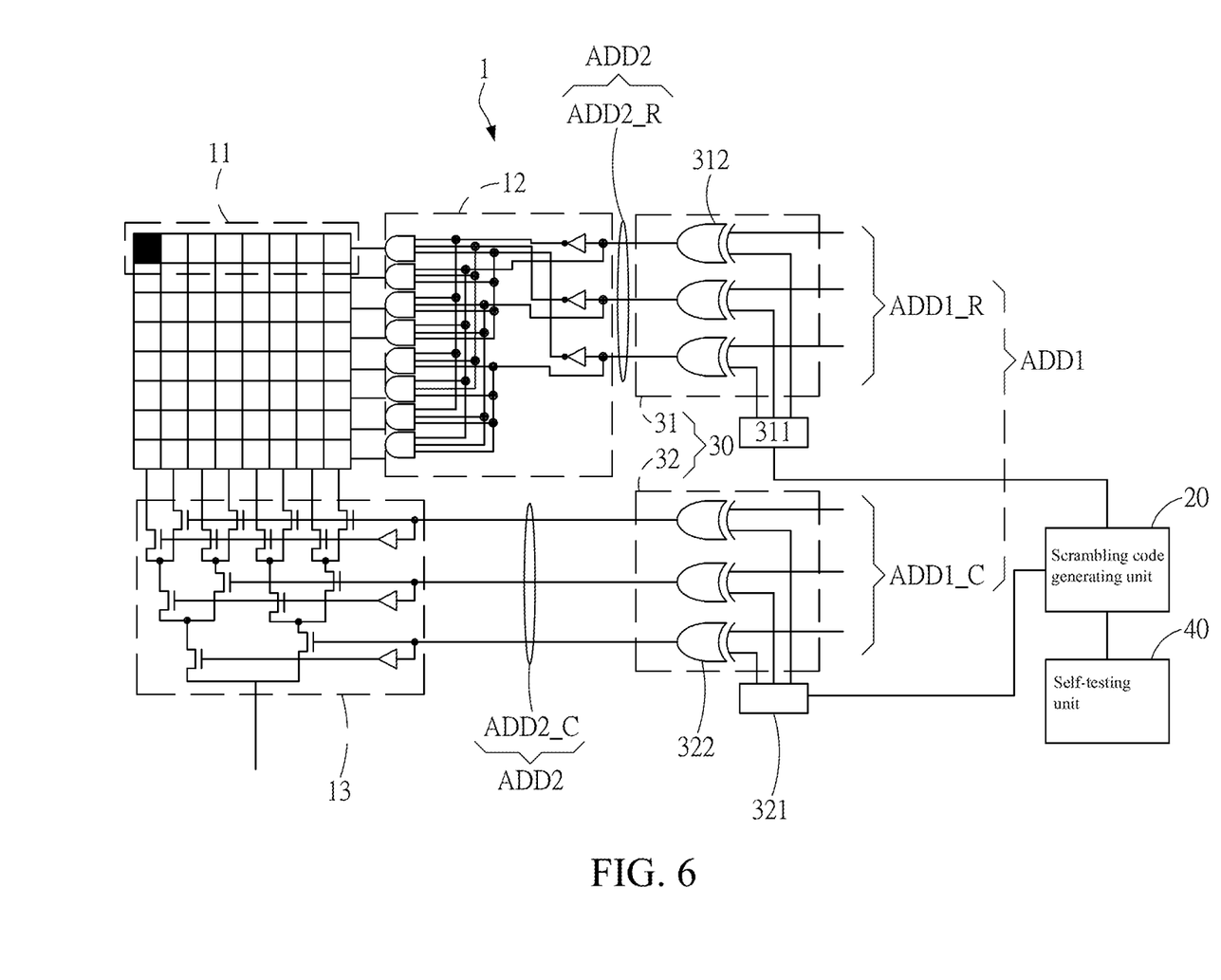
FIG. 6 is a schematic constructional view of a faulty bits scrambling memory bank of another embodiment of the disclosure.

FIG. 6 is a schematic constructional view of a faulty bits scrambling memory bank 1 of another embodiment of the disclosure. Please refer to FIG. 6, in which embodiment the memory of the disclosure is a memory bank 1 having a memory module 10, and the memory module 10 has a plurality of memory cells 100, and wherein each row of the memory module 10 is respectively one page 11, but embodiments are not limited thereto. In this embodiment which also applies the fault bits scrambling method mentioned above, an outer processor outputs the physical address ADD1 firstly, and the mapping address ADD2 is generated through the scrambling code generating unit 20 and the scrambling logic unit 30, so that the faulty memory cell 100 of the same page 11 (here, of the same row of the memory module 10), are distributed into different rows as much as possible. Based on this, the faulty memory cells 100 originally located at the same page 11 are distributed into different pages 11, so that the number of the faulty memory cells 100 in one page can be reduced, thereby preventing the volume of the resource region 140 for executing the build-in redundancy analysis algorithm from increasing or preventing the volume of the correction-code region 130 for executing the error correcting algorithm from increasing. Therefore, the repair rate and the yield rate of the memory bank 1 are improved. Additionally, for the phase change memory, the issue raised from the wearing out of the memory cells 100 is overcame by the fault bits scrambling memory bank 1 and method thereof.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A fault bits scrambling memory, comprising:
   at least a memory bank, each memory bank comprising a memory module, the memory module comprising a plurality of pages, each page comprising a plurality of memory cells, each memory cell having a physical address;
   a scrambling logic unit, receiving a scrambling code and the physical address to generate a mapping address by logical computation, and outputting the mapping address to the memory module so that an external module accesses the data of the memory cell corresponding to the mapping address according to the physical address;

a self-testing unit, detecting faulty memory cells of each page to generate a faulty information; and a scrambling code generating unit, receiving the faulty information and generating the scrambling code to maintain the number of the faulty memory cells corresponding to the mapping address of the same page is up to a maximum tolerance.

2. The fault bits scrambling memory according to claim 1, wherein each page stores an error correction code, an error correcting algorithm is based on the error correction code to repair the faulty memory cells of the page, and the maximum number of the faulty memory cells to be repairable is the maximum tolerance.

3. The fault bits scrambling memory according to claim 1, wherein the physical address comprises a first column address and a first row address, the scrambling logic unit comprises a column scrambling logic circuit and a row scrambling logic circuit, the column scrambling logic circuit receives the scrambling code and the first column address to generate a second column address, the row scrambling logic circuit receives the scrambling code and the first row address to generate a second row address, the second column address and the second row address are combined to form the mapping address.

4. The fault bits scrambling memory according to claim 3, wherein the scrambling logic unit further comprises;
   a column scrambling code register, located between the scrambling code generating unit and the column scrambling logic circuit to store the scrambling code; and
   a row scrambling code register, located between the scrambling code generating unit and the row scrambling logic circuit to store the scrambling code.

5. The fault bits scrambling memory according to claim 3, wherein the scrambling code comprises a column scrambling code and a row scrambling code, the scrambling logic unit further comprises:
   a column scrambling code register, located between the scrambling code generating unit and the column scrambling logic circuit to store the column scrambling code; and
   a row scrambling code register, located between the scrambling code generating unit and the row scrambling logic circuit to store the row scrambling code.

6. A fault bits scrambling method, applicable to a memory having a plurality of pages, each page comprising a plurality of memory cells, each memory cell having a physical address, the fault bits scrambling method comprising:
   detecting faulty memory cells of each page to generate a faulty information;
   generating a scrambling code;
   executing a logical computation with the scrambling code and each physical address to individually obtain a mapping address; and
   verifying the number of the faulty memory cells corresponding to the mapping address of the same page is up to a maximum tolerance.

7. The fault bits scrambling method according to claim 6, further comprising:
   generating an error correction code based on the data stored in the memory cells of the same page according to an error correcting algorithm;
   storing the error correction code in the page; and
   executing the error correcting algorithm according to the error correction code to repair the data stored in the faulty memory cell upon one of the pages having the faulty memory cell.

8. The fault bits scrambling method according to claim 6, further comprising:
   judging whether the number of the faulty memory cells exceeds the maximum tolerance, if yes, executing a built-in redundancy analysis algorithm to repair the data stored in the faulty memory cells.

9. The fault bits scrambling method according to claim 6, further comprising:
   accessing the data of the memory cell corresponding to the mapping address according to the physical address.

\* \* \* \* \*